United States Patent [19]

Burns

[11] Patent Number: 4,633,170
[45] Date of Patent: Dec. 30, 1986

[54] BRAGG CELL SPECTRUM ANALYZER

[75] Inventor: William K. Burns, Alexandria, Va.

[73] Assignee: The United States of America as represented by the Secretary of the Navy, Washington, D.C.

[21] Appl. No.: 617,659

[22] Filed: Jun. 5, 1984

[51] Int. Cl.[4] ............................................. G01R 23/16
[52] U.S. Cl. ................................ 324/77 K; 350/96.15
[58] Field of Search ................. 324/77 K, 77 R, 77 B, 324/77 D; 350/358, 372, 96.11, 96.12, 96.13, 96.14, 96.15

[56] References Cited

U.S. PATENT DOCUMENTS

| | | | |
|---|---|---|---|
| 3,667,038 | 5/1972 | Cutler et al. | 324/77 R |
| 3,942,109 | 3/1976 | Crumly et al. | 324/77 K |
| 4,143,940 | 3/1979 | Khoe | 350/96.15 |
| 4,253,060 | 2/1981 | Chen | 324/77 K |
| 4,328,576 | 5/1982 | Oakley | 370/3 |
| 4,348,074 | 9/1982 | Burns et al. | 324/77 K |
| 4,474,431 | 10/1984 | Bricheno | 350/96.15 |

OTHER PUBLICATIONS

"Fiber Microbend Acoustic Sensor", by Fields et al., Applied Optics, vol. 19, No. 19, pp. 3265–3267, Oct. 1, 1980.
"Single-Mode-Guide Laser Components," by Schineller, Laser Technology, Jan. 1968, pp. 77–85.
"Integrated Optic Spectrum Analyzer," by Barnoski, SPIE, vol. 209, Optical Signal Processing for $C^3/(1979)$, pp. 92–106.
"Analyzer to Rely on Light Waves to Detect RF Signals, Electronics, Dec. 22, 1977.

Primary Examiner—Michael J. Tokar
Attorney, Agent, or Firm—Sol Sheinbein; Ansel M. Schwartz

[57] ABSTRACT

A Bragg cell RF spectrum analyzer of the type having a laser input wherein the laser input is coupled to the Bragg cell analyzer by a signal-mode optical fiber for the purpose of improving the spatial quality of the laser, thus limiting side lobes of the input laser beam; and allowing the laser input to be remote from the Bragg cell.

7 Claims, 4 Drawing Figures

BRAGG CELL SPECTRUM ANALYZER

BACKGROUND OF THE INVENTION

This invention relates to a system for analyzing the frequency components of an input signal. More specifically, this invention relates to a Bragg cell spectrum analyzer with laser input used for detecting and analyzing the frequencies of incoming electromagnetic signals.

Spectrum analyzers have been developed that analyze the frequency components of electromagnetic signals. Such spectrum analyzers may consist essentially of a Bragg cell, a laser beam input, an acoustic signal input and a detector array output. (See U.S. Pat. Nos. 4,328,576; 3,667,038; 3,942,109 and "Operational Integrated Optical R.F. Spectrum Analyzer," by D. Mergerian et al., Applied Optics, Vol. 19, No. 18, pp. 3023, Sept. 15, 1978).

A Bragg cell is usually a block of crystalline material approximately 1 cm × 1 cm. in cross section and up to 10 to 20 centimeters long. A piezoelectric transducer is bonded to the end or side of the cell and tuned to the frequency band of interest. When the transducer is excited with an electrical signal, a traveling acoustic wave is set up in the cell. This causes slight changes in the refractive index of the cell material between the peaks and valleys of the acoustic pressure wave. When light is introduced at the correct angle, termed the Bragg angle, the refractions from the index changes add in phase, and Bragg diffraction takes place. A portion of the input light beam is deflected, and can be imaged onto a screen or photodetector. The amplitude of the deflected beam is proportional to the amplitude of the acoustic input and the deflection angle is proportional to the frequency of the acoustic input. If a radio frequency signal is fed into the Bragg cell, a spot of light is imaged the position of which is proportional to the signal frequency and the amplitude of which is proportional to the instantaneous signal strength. Thus, all of the modulation on the signal is preserved. If there are simultaneous multiple input signals at different frequencies within the Bragg cell bandwidth, they will be simultaneously imaged at different positions in the Bragg cell output. This is one of the key advantages of Bragg cell signal processing. Multiple signals can be processed simultaneously without the necessity for time sharing or sweeping. Another advantage is that the output is in a form suitable for further signal processing with recently developed complex detector arrays.

Nonetheless, in situations where it is desirous to use miniature semiconductor laser diodes as optical sources, for instance at 0.8 μm, for the spectrum analyzers due to their small size and low power requirements, problems exist. The spatial quality and phase front uniformity of these lasers may not be adequate for the Bragg cell optics to provide diffraction limited focal spots with low side lobes for a detector array to correctly determine the frequency components of the electromagnetic signals to be analyzed. The presence of large side lobes at the focal spot limits the available dynamic range of the spectrum analyzer and may be sufficiently serious as to render the device unusable for its intended application. In addition, the failure of the laser to provide for diffraction limited focal spots may cause an overly broad major lobe and prevent the detection of two separate frequencies within the area covered by the overly broad major lobe. These problems exist because the lateral component of the laser beam is not a smooth gaussian shape, but only approximates such a shape. (see FIG. 1) The beam thus does not allow for the spatial quality and phase front uniformity that is necessary for effective spectrum analysis. The prior art suggests the use of optical lenses to provide a solution to the problem, as is shown in U.S. Pat. No. 4,253,060 which deals with the spontaneous emission problem that is prevelant with all semiconductor lasers.

SUMMARY OF THE INVENTION

Accordingly, one object of the invention is to provide a near-ideal Gaussian spatial beam for optical input to a Bragg cell spectrum analyzer.

Another object of the invention is to provide a radiation mode stripper that will remove the cladding mode of the light that is being conducted through the optical fiber.

Yet another object of the invention is to provide for a laser input to be remote from the Bragg cell.

Another object of the invention is to provide a near-ideal Gaussian spatial beam for optical input to a Bragg cell spectrum analyzer that is produced by a semiconductor laser diode that is of small size and low power requirements.

Briefly, the above and other objects are realized by the spectrum analyzer of the present invention comprising: an optical source means for providing light, a spatial filter means which conducts the light produced by the optical source means and which causes the light to be spatially well-behaved, a radiation mode stripping means which removes the cladding modes of the light that is conducted through the spatial filter means, an analyzer means for determining the frequency components of an RF signal, and a RF signal means which delivers an RF signal to be analyzed to the analyzer means.

The spatial filter means is located between and coupling the optical source means and analyzer means so that light emitted by the optical source means is conducted through the spatial filter and into the analyzer means. The radiation mode stripping means is located on and around the spatial filter means, and the RF signal input means is connected to the analyzer means so that the frequency components of the RF signal that is inputed into the analyzer means can be determined.

DESCRIPTION OF THE PREFERRED EMBODIMENT

Figure 3:
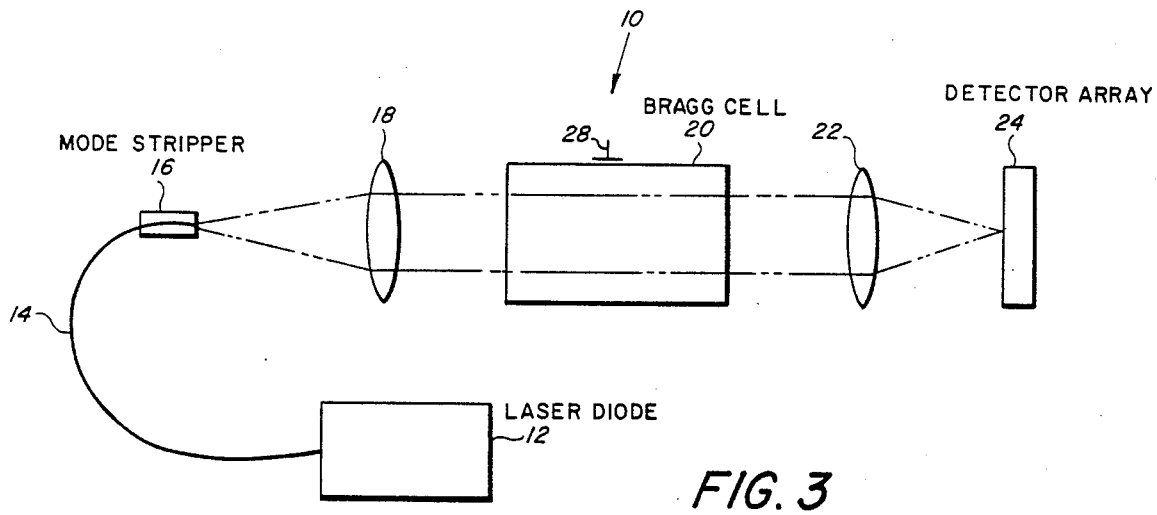
FIG. 3 is a schematic diagram of a bulk optical Bragg cell.

Referring now to the drawings, wherein like reference numerals designate identical or corresponding parts throughout, and more particularly to FIG. 3 thereof, numeral 10 designates a spectrum analyzer system. Comprising the spectrum analyzer system 10 is a fiber-coupled laser package 12. A typical semiconductor laser diode that would be utilized due to its small size and low power requirements, thus optimizing weight and space and making the laser optical for an aerospace environment, would be for instance, a 0.8 μm laser diode. The laser diode 12 is coupled to a polarization-holding fiber 14. The polarization holding fiber is a single mode fiber and has the advantage of maintaining the linear state of the light that is emitted by the laser diode 12 and which excites the optical fiber 14. As a result, the fiber 14 is able to be bent while not changing the state of polarization of the conducted light. The coupling of the fiber 14 to the laser 12 is a well known technique. One example of such a coupling is described in U.S. Pat. No. 4,143,940. A fiber mode stripper 16 is located at the end of the fiber 14. The mode stripper 16 may be implemented, by way of example is just black paint that coats the surface of the fiber and extends about 2 or 3 inches along the fiber 14. The radiation mode stripper 16 has the effect of absorbing the cladding modes which may also cause erroneous sidelobes on the detector array 26. Fiber 14 though, does require the additional step of rotating the axis of the fiber to align with the optical polarization of the light emitted by the laser 12.

Alternatively one could use an ordinary single mode fiber if the length of the fiber was sufficiently small and bending sufficienty gentle to avoid alteration of the optical polarization state. The fiber 14 transmits a near Gaussian spatial mode only, with extraneous radiation going into radiation modes which can be stripped by well known techniques. Since the fiber mode is well behaved spatially, its phase front must also be well behaved. When such an ideal Gaussian mode is focused, its side lobes are calculable by conventional theory, and will not be anomalously large. For example, in FIG. 1 we show the output of a typical semiconductor laser with poor spatial quality and in FIG. 2 the output of a laser excited single mode fiber ($\sim$2 meters long) with excellent spatial quality.

Figure 1:
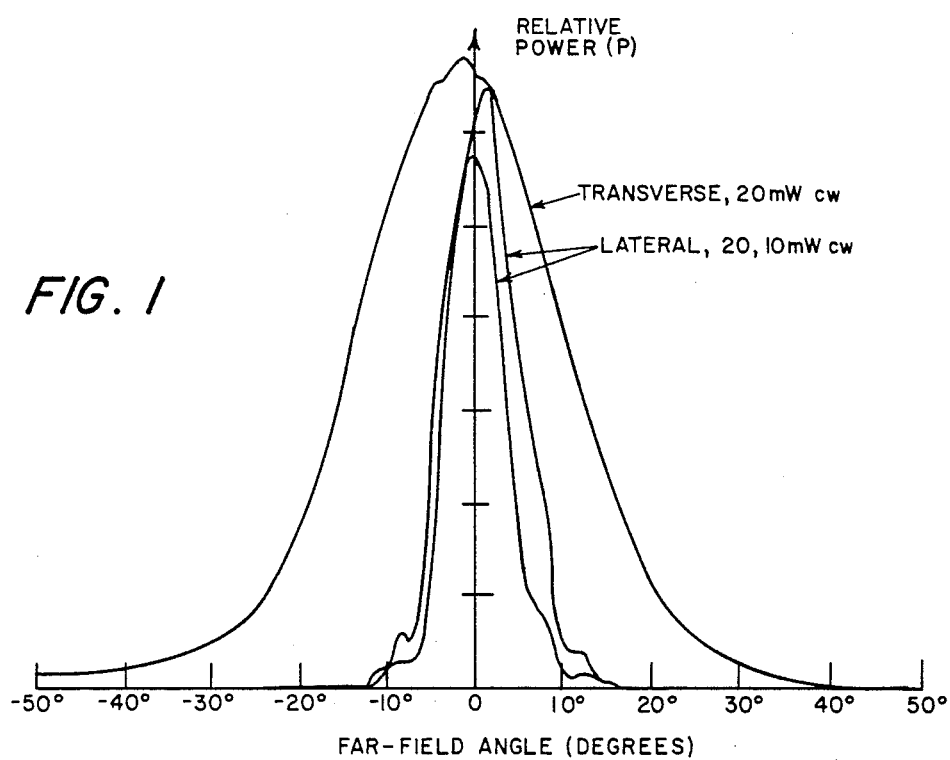
FIG. 1 is a graph of the output of a typical semiconductor laser with poor spatial quality.
Figure 2:
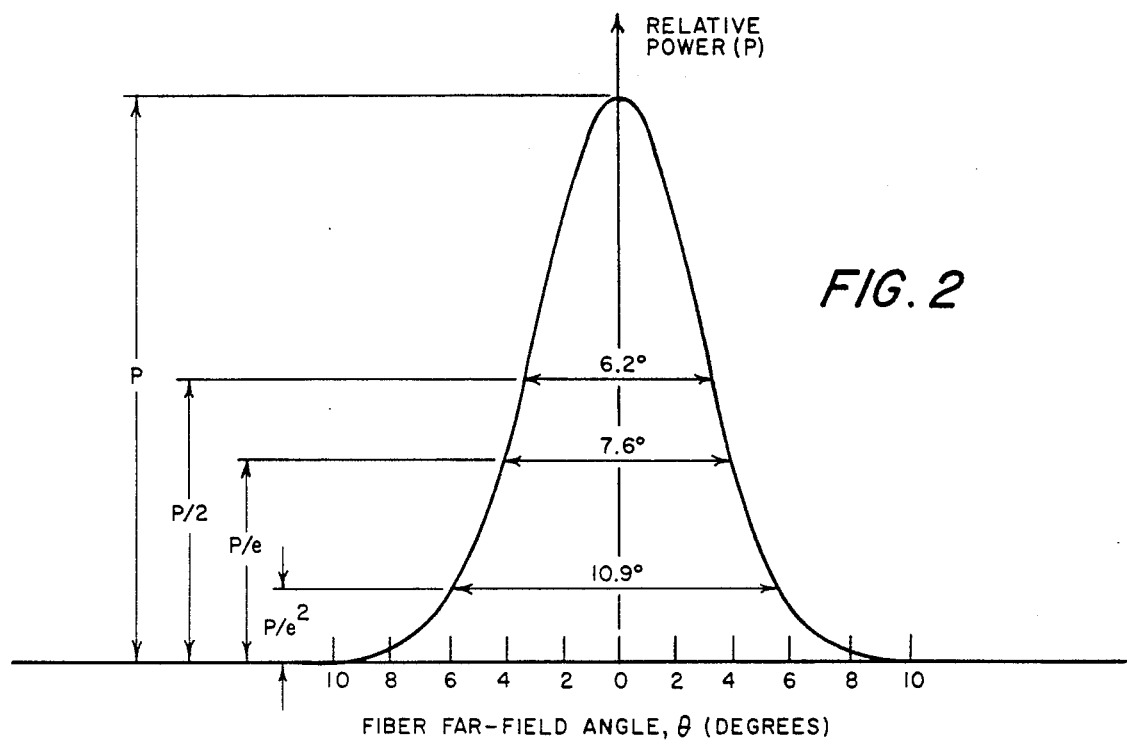
FIG. 2 is a graph of the output of a laser excited single mode fiber with excellent spatial quality.

In FIGS. 1 and 2 the far-field angle is the divergence angle of the beam measured in the far-field from the laser, the far-field being greater than 1 millimeter in distance from the laser. Transverse and lateral in FIG. 1 refers to the relative planes of the junction of the laser with, for example, the lateral or parallel plane being parallel to the plane of the paper in FIG. 3 and FIG. 4 of the analyzer. The term 20 mW CW means 20 milliwatts continuous wave or steady state and the terms $P/2$, $P/e$ and $P/e^2$, as is well known in the art, means the half power or 0.50 point, the $1/e$ or 0.37 point and the $1/e^2$ or 0.14 point, respectively. The angles 6.2°, 7.6° and 10.9° are just the distance of the far-field angles measured from the X-axis between the curve at the $P/2$ point, the $P/e$ point, and the $P/e^2$ point, respectively. Better than 5 mW output can be obtained with suitable lasers and fibers. (See RCA Contract N00014-81-C-2522, Final Report available at the Naval Research Laboratory, Washington, DC.).

Figure 4:
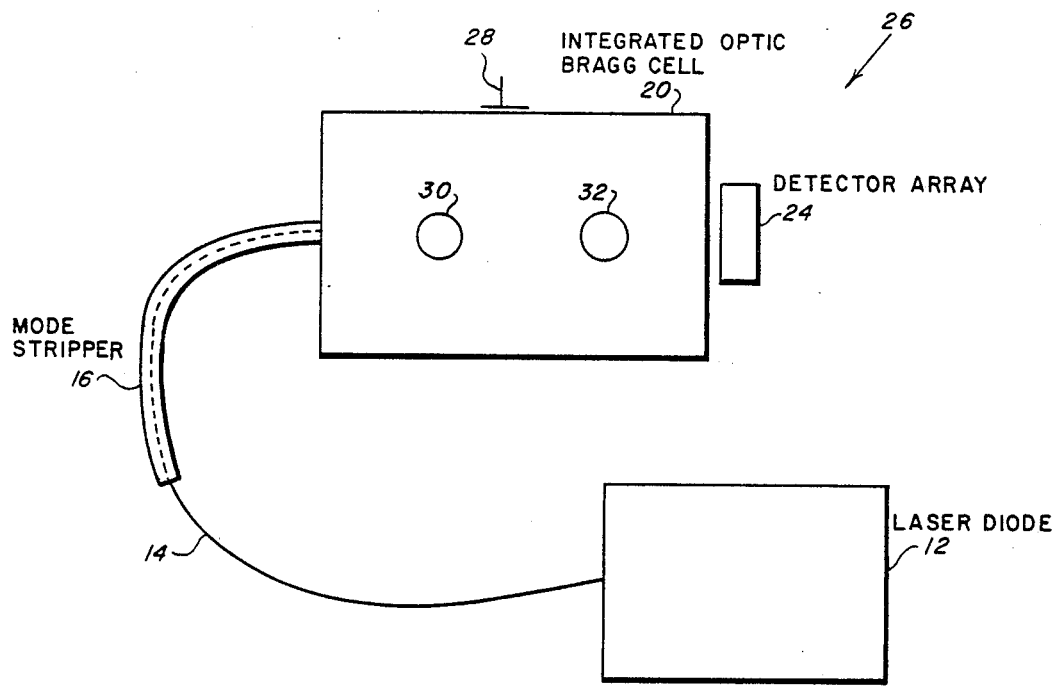
FIG. 4 is a schematic graph of an integrated optical Bragg cell.

The single-mode optical fiber can be used with either a bulk optic Bragg cell 20 or an integrated optical Bragg cell 28 (IOSA), see FIG. 4. In each case the fiber output end is placed where the laser output facet would normally be placed. For the IOSA this eliminates the laser-substrate coupling problem which has been a technical difficulty and replaces it with a fiber-substrate coupling problem which is simpler. The laser-fiber component is still compatible with the IOSA, without adding bulk.

The fiber section 14 can be coiled in a small (1 to 2 inches) diameter loop if, for instance, the laser 12 is to be situated closer in distance to the Bragg cell 20 than the distance necessary for effective radiation mode stripping. By situating the laser 12 remote from the Bragg cell 20 the laser 12 can be mounted conventionally on its own heat sink by the manufacturer and can be temperature controlled in its own package, away from the Bragg cell substrate. In addition, fiber diffraction can be controlled by the numerical aperture (NA) of the fiber 14, which is easily done by the fiber manufacturer. This relaxes a constraint on the laser 12 and allows smaller collimating lenses 18 to be used with some slight possible reduction in laser fiber coupling efficiency.

A fiber coil may or may not be used since only a 2 to 3 inch length is required for radiation mode stripping. Mode stripping can simply be a section of fiber coated with black paint or black ink. Or, as an alternative to black paint or ink for mode stripping, an optical fiber whose jacket absorbs the cladding mode which the black paint or ink strips away can be used.

In the case of a bulk optic Bragg cell (FIG. 3) the other end of the fiber 14 is aligned in front of the collimating lens 18. The end of the fiber 14 is located and aligned in the same position as where the laser output facet would normally be placed. The amount of space between the end of the fiber 14 and the collimating lens 18 depends on the specification of the elements chosen to make up the particular spectrum analyzer system. The location of the end of the fiber 14 relative to the collimating lens 18 can be determined by well-known methods.

The collimating lens 18 shapes the light beam emitted by the fiber 14 in the desired shape for spectrum analysis by the Bragg cell 20. The Bragg cell 20 has transducers 28 that carry the input to the Bragg cell 20 to be analyzed. The Bragg cell 20 is excited by the transducers 28 which causes the refractive index of the Bragg cell 20 to change according to the frequency components in the input. The Bragg cell 20 has the ability to discern many different frequency components simultaneously because many layers of different refractive index, according to the frequencies inputed, are able to be established in the cell. The light collimated by the collimating lens 18 and passing through the Bragg cell 20 is diffracted according to the refractive index of the Bragg cell 20 it passes through and in accordance with Bragg's law The light that is diffracted passes out of the Bragg cell and is refocused by a refocusing lens 22 onto a detector array 24. The position on the detector array the diffracted light is refocused on determines what frequency that particular frequency component is at. Each frequency component will cause a corresponding and unique refractive index in the Bragg cell 20 which will cause the entering light to be diffracted according to a unique angle, relative to the system, and which, in turn, will cause the diffracted light to be refocused at a unique position on the detector array 24.

In the IOSA system of FIG. 4, the output end at the fiber is placed directly adjacent to the edge at the integrated optical substrate where the laser would normally be placed. The collimating lens 30 and refocusing lens 32 of the IOSA provide the same function as lens 18 and 22, respectively.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for determining the component wavelengths of an RF signal comprising:

aiming light possessing a poor spatial quality from a miniature semiconductor laser diode having low power requirements into a single mode optical fiber;

conducting the light through the optical fiber;

stripping away unwanted modes of the light being conducted through the optical fiber so a near gaussian spatial light beam is emitted by the optical fiber;

exciting a Bragg cell with an RF signal passing through a transducer attached to the Bragg cell;

introducing the light emitted by the optical fiber into the Bragg cell so the light is diffracted by the excited Bragg cell whose refraction index is determined by the RF signal; and focusing the diffracted light onto a detector array, the detector array being situated so that that position where the diffracted light is focused on the detector array corresponds to a unique RF frequency wavelength.

2. A spectrum analyzer comprising:

a miniature semiconductor laser diode having low power requirements of no more than ½ watt which provides light possessing a poor spatial quality;

a Bragg cell;

a collimating lens located between the Bragg cell and the diode;

a single-mode optical fiber located between the diode and the lens so that light emitted by the diode is conducted through the fiber, passes through the collimating lens and into the Bragg cell;

radiation mode stripping means coating the fiber so any cladding modes of light in the fiber are absorbed;

a transducer located on the Bragg cell which excites the Bragg cell causing Bragg diffraction of the light in the Bragg cell from the diode cell which an RF signal is inputted through the transducer and into the Bragg cell;

a refocusing lens located to receive the diffracted light from the Bragg cell; and a detector array being situated to receive the refocussed light from the refocussing lens so that the position where the refocussed light is refocussed on the detector array identifies a unique RF frequency wavelength wherein the unique RF frequency wavelength corresponds to the frequency of the inputted RF signal.

3. A spectrum analyzer comprising:

a miniature semiconductor laser diode having low power requirements of no more than ½ watt which provides light possessing a poor spatial quality;

an integrated optic Bragg cell having a collimated side and a refocusing side;

a single-mode optical fiber located between the diode and the Bragg cell so that light emitted by the diode is conducted through the fiber and into the cell by way of the collimated side;

radiation mode stripping means coating the fiber so any cladding modes of light in the fiber are absorbed;

a transducer located on the cell which excites the Bragg cell causing Bragg diffraction of the light in the Bragg cell from the diode cell when an RF signal is inputted through the transducer and into the Bragg cell;

a detector array being situated to receive the refocussed light from the refocussing side of the cell so that the position where the refocussed light is refocussed on the detector array identifies a unique RF frequency wavelength corresponds to the frequency of the inputted RF signal.

4. A spectrum analyzer as described in claim 2 wherein the semiconductor laser diode is a 0.8 μm miniature semiconductor laser diode.

5. A spectrum analyzer as described in claim 4 wherein the radiation mode stripping means is black paint which coats the outside of the optical fiber.

6. A spectrum analyzer as described in claim 3 wherein the semiconductor laser diode is a 0.8 μm miniature semiconductor laser diode.

7. A spectrum analyzer as described in claim 6 wherein the radiation mode stripping means if black paint which coats the outside of the optical fiber.

* * * * *